United States Patent [19]

Sato et al.

[11] 4,400,454

[45] Aug. 23, 1983

[54] PROCESS OF PRODUCING COLOR SOLID IMAGE PICKUP ELEMENT BASE PLATES

[75] Inventors: Masamichi Sato; Eiichi Hasegawa; Koji Shimanuki, all of Asaka, Japan

[73] Assignee: Fuji Photo Film Co., Ltd., Kanagawa, Japan

[21] Appl. No.: 399,090

[22] Filed: Jul. 16, 1982

[30] Foreign Application Priority Data

Jul. 16, 1981 [JP] Japan ............................... 56-111367

[51] Int. Cl.³ ................................................ G03F 5/00

[52] U.S. Cl. ........................................ 430/7; 430/321; 430/323; 430/365

[58] Field of Search .................... 430/7, 321, 323, 365

[56] References Cited

U.S. PATENT DOCUMENTS

| | | | |
|---|---|---|---|
| 3,271,345 | 9/1966 | Nadeau et al. | 430/225 |
| 4,081,277 | 3/1978 | Brault et al. | 430/200 |
| 4,169,009 | 4/1980 | Martin et al. | 430/321 |
| 4,271,246 | 6/1981 | Sato et al. | 430/7 |
| 4,342,818 | 8/1982 | Yokota et al. | 430/7 |
| 4,345,021 | 8/1982 | Ogawa et al. | 430/321 |

*Primary Examiner*—J. Travis Brown

*Attorney, Agent, or Firm*—Sughrue, Mion, Zinn, Macpeak and Seas

[57] ABSTRACT

A multicolor solid image pickup element having bonding pat portions is prepared by an on-wafer method utilizing a silver halide photographic emulsion. A solvent permeating preventing layer is formed on a solid image pickup element base plate having an array of image elements. A silver halide emulsion layer is then formed in the layer, and the emulsion layer is removed at the portions corresponding to the bonding pat portions of the base plate. A micro color filter composed of two or more color separation filter elements is then formed in the emulsion layer by applying thereto a repeating pattern exposure, followed by color development. Each of the color filter elements corresponds to each image element, and a protective layer is formed on the whole surface of the base plate. The protective layer and the solvent permeation preventing layer are then successively removed at the portions corresponding to the bonding pat portions.

12 Claims, 9 Drawing Figures

PROCESS OF PRODUCING COLOR SOLID IMAGE PICKUP ELEMENT BASE PLATES

CROSS REFERENCE

This application is related to another U.S. application Ser. No. 399,080 entitled Process for Producing Color Solid Image Pickup Element Base Plates. The related application was filed concurrently with this application in the U.S. and it is based on Japanese Patent Application No. 111368/81.

FIELD OF THE INVENTION

This invention relates to a process for producing a color solid image pickup element base plate, and more particularly to a process of producing a color solid image pickup element base plate by directly forming a micro color filter on a solid image pickup element base plate.

BACKGROUND OF THE INVENTION

A single plate-type or two plate-type color solid pickup element (or color solid imaging element) has laminated on the surface thereon micro color filters composed of multicolor separation filter elements of red, green, and blue or of cyan, magenta, and yellow corresponding to each image element constituting the image pickup element. The production process for such a solid image pickup element is generally classified into a lamination process and an on-wafer process. The on-wafer process is described in, for example, U.S. Pat. Nos. 4,081,277, 3,271,345 and 3,707,373.

In the former process, a color solid image pickup element is prepared by separately forming a solid image pickup element base plate and a micro multicolor filter plate having disposed on a transparent support color separation filter elements corresponding to each image element of the solid image pickup element. The plates are then bonded to each other. On the other hand, in the latter process, a micro multicolor filter is formed directly on a solid image pickup element base plate.

Accordingly, the former process requires precise registration of each color separation filter element and each image element of a solid image pickup element before bonding the two plates. However, by using the latter process, it is possible to employ the process of forming the micro multicolor filter as a part of a semiconductor production process. Therefore, the latter process is said to be an inevitable technique for producing color solid image pickup elements at low cost.

In addition, as the latter process, there are a process of forming on a wafer having formed therein a number of regularly disposed solid image pickup elements color separation filter elements each corresponding to each image element of said solid image pickup elements to simultaneously form a number of color solid image pickup elements and a process (on-chip process) of forming a color separation filter element on a single solid image pickup element (chip) cut from the foregoing wafer having a large number of solid image pickup elements. These processes are all called "on-wafer process" in this application.

SUMMARY OF THE INVENTION

An object of this invention is, therefore, to provide a novel process of producing a color solid image pickup element base plate by an on-wafer process.

Another object of this invention is to provide a process for producing a color solid image pickup element base plate by an on-wafer process capable of producing color solid image pickup elements easily and at low cost by using a silver halide photographic technique.

According to the present invention, there is provided a process of producing a color solid image pickup element base plate comprising the steps of;

coating a solvent permeation preventing layer formed on the surface of a solid image pickup element base plate with a silver halide emulsion layer;

removing the silver halide emulsion layer at at least the portions corresponding to bonding pat portions of the solid image pickup element base plate to reveal the solvent permeation preventing layer at the portions;

forming a micro color filter composed of at least two-color color separation filter elements corresponding to each image element of the solid image pickup element base plate by repeatedly applying image exposure and color development to the remaining silver halide emulsion layer for each color;

forming a protective layer on the whole surface of the solid image pickup element base plate having the micro color filter thus formed thereon; and removing the protecive layer and the solvent permeation preventing layer at the portions corresponding to the bonding pat portions of the solid image pickup element base plate to reveal the bonding pat portions.

DESCRIPTION OF THE PREFERRED EMBODIMENT

The invention will be described below in more detail by referring to the accompanying drawings. However, the scope of the present invention is in no way limited by these drawings or the specific embodiments they represent.

Figure 1:
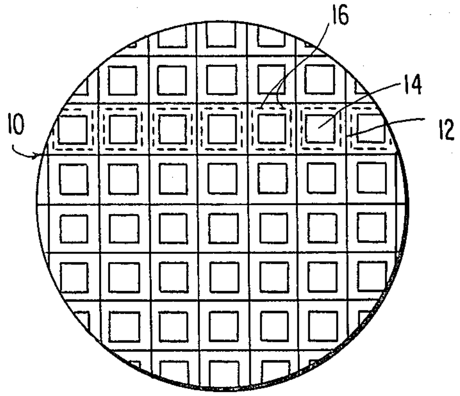
FIG. 1 is a plan view of a solid image pickup element base plate used in the process of this invention.
Figure 2:
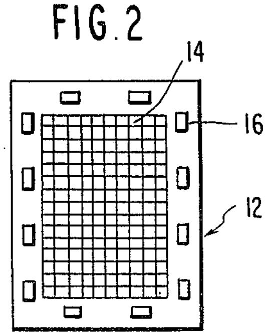
FIG. 2 is an enlarged plan view of one base plate of the solid image pickup element shown in FIG. 1.
Figure 3:
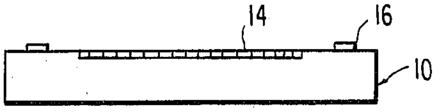
FIG. 3 is a schematic cross-sectional view of the base plate shown in FIG. 2, and FIG. 4 to FIG. 9 are cross-sectional views showing the steps of forming a color solid image pickup element base plate by the process of this invention.

FIG. 1 shows a wafer-type solid image pickup element base plate used in this invention. The numeral 10 shows a solid image pickup element base plate having a large number of regularly arrayed solid image pickup elements 12 formed on a silicon wafer by a wafer process. As shown in FIG. 2 and FIG. 3, each solid image pickup element 12 has an image-receiving portion 14 having an array of image elements and a bonding pat portion 16 for connecting a leading wire.

FIG. 4 to FIG. 9 are schematic cross-sectional views showing the steps of producing a color solid image pickup element base plate by forming a micro color filter on the wafer-type solid image pickup element base plate 10 as shown in FIG. 1 and for simplifying the explanation of the production steps, the steps are described in these figures by referring to one solid image pickup element 12.

Figure 4:
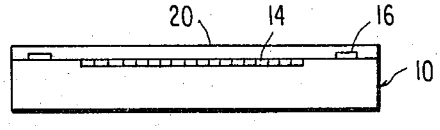

FIG. 4 is a schematic cross-sectional view showing the plate 10 after a solvent permeation preventing layer 20 has been formed on the surface of the plate 10 shown FIG. 3. The solvent permeation preventing layer 20 is a layer for preventing each processing solution (mainly, an aqueous solution) from contacting the surface of plate 10. The processing solution is used for removing a silver halide emulsion layer and forming a micro color filter in the silver halide emulsion layer as will be described later. Such a solvent permeation preventing layer 20 is formed by a material which can prevent the permeation of such a solvent or solution without producing bad electrochemical influences on the surface of the solid image pickup element base plate 10.

The material for forming the solvent permeation preventing layer 20 is selected from, for example, inorganic materials such as silicon nitride, silicon carbide, silicon oxide and phosphosilicate glass. The layer 20 may be formed by a chemical vapor deposition method, a plasma chemical vapor deposition method, or a sputtering method. In particular, silicon nitride and phosphosilicate glass are preferably provided by the plasma chemical vapor deposition method and the chemical vapor deposition method, respectively. Other useful materials for forming the layer 20 include various photoresists such as KPR and KTFR (trade names, of Eastman Kodak, Co.), TPR and OMR-83 (trade names, made by Tokyo Ooka Kogyo K.K.), AZ-1350 (trade name, made by Shipley Company), etc.; various electron beam resists such as polymethyl methacrylate, polyglycidyl methacrylate, etc.; and various polymers such as cellulose acetate, soluble polyester, polyamide, polyvinyl chloride, polyvinyl acetate, vinyl chloride-vinyl acetate copolymer, polyisoprene, styrene-butadiene latex, polyvinyl alcohol, polymethyl methacrylate, polyvinyl butyral, polyparaxylylene, etc. Of these materials, silicon nitride, phosphosilicate glass and photoresist KPR are preferred.

Figure 5:
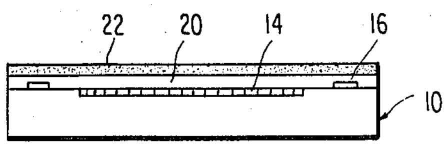

A silver halide emulsion layer 22 is then formed on the surface of the solvent permeation preventing layer 20 which is formed on the plate 10 as shown in FIG. 5.

The silver halide emulsion used in this invention may be prepared by dispersing a silver halide in an aqueous solution of a water-soluble binder by a conventional manner. In this invention, fine grain silver halide emulsions are particularly preferred. An example of a particularly preferred emulsion is a so-called Lippmann emulsion in which the mean grain size of the silver halide is not more than about 0.1 $\mu$m. The weight ratio of silver halide to the water-soluble binder is in a range of from about 1:6 to about 8:1. In general, any silver halide can be used in this invention with suitable examples being silver chloride, silver bromide, silver iodide, silver chlorobromide, silver iodobromide, silver chloroiodide, silver chloroiodobromide, etc. Examples of the water-soluble binder used in this invention are gelatin, albumin, casein, cellulose derivatives, agar, sodium algiante, sugar derivatives, polyvinyl alcohol, polyvinylpyrrolidone, polyacrylamide, etc. If necessary, a mixture of two or more miscible binders illustrated above may be used. The dry thickness of the silver halide emulsion layer 22 is preferably about 0.8 $\mu$m to about 10 $\mu$m. If necessary, a subbing layer may be formed between the silver halide emulsion layer 22 and the solvent permeation preventing layer 20 in order to make the coating of the silver halide emulsion layer 22 uniform. In order to coat the silver halide emulsion layer 22, a spin coating method which is usually employed in a process of coating a photoresist on the surface of a semiconductor wafer can be used.

Figure 6:
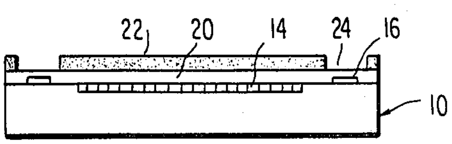

The silver halide emulsion layer 22 formed on the solid image pickup element base plate 10 is, then, removed at at least the portions corresponding to bonding pat portions 16 as shown in FIG. 6. A numeral 24 in FIG. 6 shows the removed portion of the silver halide emulsion layer 22. Any desired method may be employed for removing the silver halide emulsion layer 22 at the portions corresponding to the bonding pat portions 16. In accordance with one method, the removal is performed by applying a pattern exposure and development (without fixing) to the portions of the silver halide emulsion layer to be removed to form a silver image pattern followed by etch-bleaching processing.

The developing agent for forming the silver image pattern may be a material well known in the field of photography, such as hydroquinone, pyrogallol, 1-phenyl-3-pyrazolidone, p-aminophenol and ascorbic acid.

The developer used for the foregoing purpose may, if required, contain various additives such as an alkalifying agent (e.g., sodium hydroxide, sodium carbonate, etc.), a pH controlling agent or a buffer (e.g., acetic acid, boric acid, etc), a preservative (e.g., sodium sulfite, etc.), an antifoggant (e.g., potassium bromide, etc.), etc.

Etch-bleaching is a phenomenon that when a silver halide emulsion layer having a silver image is processed by an etch-bleaching solution, the silver image portion of the silver halide emulsion is removed.

Any known etch-bleaching solution can be used in this invention. Such solutions are described in, for example, *TAGA Proceedings,* pp. 1-11 (1967) and *PSA Technical Quarterly,* Nov., pp. 130-134 (1955). Practical examples of the etch-bleaching solution are an aqueous solution containing cupric chloride, citric acid, and hydrogen peroxide; an aqueous solution containing copper nitrate, potassium bromide, lactic acid, and hydrogen peroxide; an aqueous solution containing ferric nitrate, potassium bromide, lactic acid, and hydrogen peroxide; an aqueous solution containing ferric nitrate, potassium bromide, and lactic acid; and an aqueous solution containing stannic chloride and potassium bromide.

In this invention using a wafer-type solid image pickup element base plate 10 having an array of a number of solid image pickup elements 12 as shown in FIG. 1, it is advantageous to remove the portions 24 of the silver halide emulsion layer 22 corresponding to the bonding pat portions 16 after forming the solvent permeation preventing layer 20 and the silver halide emulsion layer 22 on the base plate as shown in FIG. 4 and FIG. 5 but before the formation of a micro color filter and the subsequent steps described later. That is, the following merits are obtained. When the silver halide emulsion layer is formed on the base plate by spin coating, the thickness of the silver halide emulsion layer at the peripheral portion of the base plate becomes much thicker than the emulsion layer at the central portion. This is caused by the poor wetting property of the base plate with the silver halide emulsion and also the increased viscosity of the silver halide emulsion due to the reduction in temperature of the emulsion during the rotation of the base plate, as stated in Japanese Patent Application (OPI) Nos. 17813/77 and 17814/77.

If the thickness of the coated layer at the peripheral portion of the base plate is substantially thicker than the thickness of the coated layer at the central portion, the silver halide emulsion layer at the peripheral portion swells. The swelling is particularly large during the development procedure. The swelling causes stress to be applied to the coated emulsion layer at the swollen portion making the emulsion layer readily peelable. Furthermore, the flatness of the silver halide emulsion layer is reduced by the swelling causing troubles upon contact exposure for the formation of micro color filter. The reduced flatness causes a strain in the pattern obtained. The swelling may also cause fine powders of the emulsion layer (fine emulsion pieces) occur causing reduction in the yield for the color solid image pickup elements obtained. However, by removing the swelled portion or thick portion of the silver halide emulsion layer at the peripheral portion of the base plate simultaneously with the removal of the portions of the silver halide emulsion layer corresponding to the bonding pat portions 16 as described above, the foregoing faults can be eliminated.

Furthermore, when using the wafer-type solid image pickup element base plate as shown in FIG. 1, it is preferable to remove the silver halide emulsion layer at the portions corresponding to dicing portions simultaneously with the removal of the silver halide emulsion layer at the portions corresponding to at least the bonding pat portions. Dicing is the process of cutting each chip from a multichip wafer. Dicing is usually performed while supplying cooling water to the cutting portion to cool the heat generated during dicing. Further washing with an organic solvent such as trichlene, acetone, etc. is performed after dicing. Therefore, if the silver halide emulsion exists at the cut portions, the emulsion layer at the cut portions will be swollen which will cause peeling of the emulsion layer. The peeling of the emulsion layer at such portions does not directly influence the formation of the micro color filter of this invention if the emulsion layer carrying a micro color filter formed thereon is not peeled. However, fine emulsion pieces which are peeled may attach to the surface of the micro color filter formed and reduce the yield of the product, i.e., the color solid image pickup elements. Consequently, by perviously removing the silver halide emulsion layer at the portions corresponding to such dicing portions, the foregoing fault can be eliminated.

Figure 7:
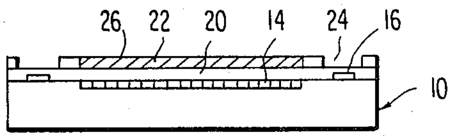

A micro color filter 26 is formed on the solid image pickup element base plate 10. The micro color filter 26 is composed of color separation filter elements of red, green, and blue or of cyan, magenta, and yellow corresponding to each image element of the light-receiving portion 14 as shown in FIG. 7.

The micro color filter 26 is formed by forming at least two-color color separation filter elements by applying a color photographic development process for each color. The process of using color coupler-containing developers was previously proposed in U.S. Pat. No. 4,271,246 herein incorporated by reference and the process of using developers containing dye developers was described in U.S. patent application filed Dec. 22, 1980, now U.S. Pat. No. 4,342,818 herein incorporated by reference.

When utilizing the former process, at least one black and white silver halide emulsion layer 22 is exposed to light through a pattern of a first color (e.g., cyan) corresponding to the specific image element of the light-receiving portion 14. A pattern containing a dye of the first color (cyan) is then formed by development with a developer containing the color coupler. Preferably, after removing silver contained in the foregoing pattern by bleaching or rehalogenating the silver, the unexposed silver halide emulsion layer containing silver halide is then exposed to light through a pattern of a second color (e.g., magenta). The exposure is made at the portions corresponding to different image elements than the foregoing image elements. A pattern containing a dye of the second color (magenta) is then formed by developing with a developer containing the color coupler. If necessary, after bleaching or rehalogenating silver in the second color pattern as described above, a pattern containing a dye of a third color (e.g., yellow) may be formed. This pattern is formed by a similar step to the above-described step. Accordingly, at least two-color patterns and perhaps three-color patterns are formed. After the final color development, a silver removing procedure is performed. This involves removing any silver grains remaining in the patterns by bleaching. In addition, any remaining silver halide is removed by fixing. Accordingly, a micro color filter is formed.

When using the latter process, at least one silver halide emulsion layer is exposed to light through a pattern for a first color by the manner as described above. The exposed layer is then developed with a developer containing a dye developer of the first color to form a pattern containing the dye of the first color. Preferably, after removing silver contained in the pattern by bleaching or rehalogenating the silver, at least two-color patterns are formed by repeating at least once the foregoing step of performing a pattern exposure for a second color and developing with a developer containing the dye developer for the second color. Thereafter, by performing a silver removing procedure, a micro color filter is formed.

Furthermore, a combination of the foregoing two processes can be used for forming a micro color filter in this invention.

In addition, in the foregoing two processes, after forming a dye pattern corresponding to each image element by performing a pattern exposure, a color development, and bleaching for each color, by applying light exposure and black and white development to the spaces between the dye patterns prior to performing the silver removing procedure (i.e., fixing procedure) as described in Japanese Patent Application (OPI) No. 75606/81, the space between the dye patterns can be blackened. By employing the foregoing procedure, the occurrence of diffused reflection at the spaces between image elements, such as the portions of the transfer electrodes of interline CCD can be prevented. Furthermore, the S/N ratio of light-receiving signal at the color solid image pickup element thus obtained can be further increased.

The light source used to form a micro color filter of this invention may be a light source emitting light of wave lengths sensitive to the particular silver halide emulsion layer used. For example, it is possible to use a light source which emits white light.

Conventional color coupler-containing developers and dye developers may be used in the foregoing processes. Furthermore, conventional bleach solutions and fix solutions may be used in this invention. Such conventional solutions are described in detail in the foregoing U.S. Pat. No. 4,271,246 and U.S. patent application U.S. Pat. No. 4,342,818.

Figure 8:
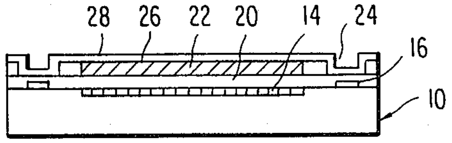

As shown in FIG. 8, a protective layer 28 is then formed over the whole surface of the solid image pickup element base plate 10 having the micro color filter 26. The protective layer 28 is used mainly for increasing the mechanical strength of the surface of the micro color filter 26. Therefore, the layer 28 is formed of a material having high mechanical strength as compared to the silver halide emulsion layer. Furthermore, the material should have good transparency. The material may be an inorganic material such as glass or organic materials such as various polymers. However, in view of the step of revealing the bonding pads 16 as will be described later, various photoresists (photopolymers) are preferably used to form the layer 28.

Figure 9:
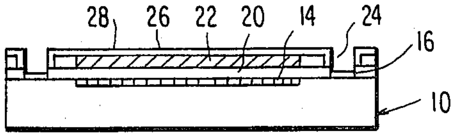

The bonding pat portions 16 having the protective layer 28 on the whole surface thereof are revealed as shown in FIG. 9. When the protective layer 28 is composed of, for example, a photoresist, revealing of the bonding pat portions 16 may be performed by light exposure and development of the desired portions of the photoresist layer. This uncovers portions corresponding to the bonding pat portions 16. The solvent permeation preventing layer 20 is then removed at the uncovered portions by an optional method. When the protective layer 28 is composed of a material other than photoresist, a photoresist is coated on the protective layer 28. Then after light exposing and developing the photoresist layer at the portions corresponding to the bonding pat portions 16 to uncover the said portions, the protective layer 28 and the solvent permeation preventing layer 20 may be removed at the uncovered portions.

When the solvent permeation preventing layer 20 is composed of, for example, a glass such as phosphosilicate glass, the layer can be removed with a solvent such as ammonium fluoride. It may also be removed by dry etching using plasma containing a gas such as freon-12 ($CCl_2F_2$). Furthermore, when the solvent permeation preventing layer 20 is composed of a polymer, the polymer layer can be removed with a solvent for the polymer. Still further, when the solvent permeation preventing layer 20 is composed of a photopolymer, etc., the photopolymer layer may be selectively exposed to light in order to improve the solubility or removability of the portions corresponding to the bonding pat portions 16 prior to applying a silver halide emulsion on the solvent permeation preventing layer 20.

According to the process of this invention, a protective layer is formed on a color solid image pickup element base plate of which the silver halide emulsion layer has been removed at at least the portions corresponding to the bonding pat portions. The protective layer is then removed at the portions corresponding to the bonding pat portions to reveal the bonding pat portions. The silver halide emulsion layer carrying a micro color filter formed thereon can be completely covered by the protective layer without being revealed. This prevents the deterioration of the micro color filters during the dicing step wherein each color solid image pickup element is cut from the multichip wafer after forming the micro color filters.

When a number of color solid image pickup elements are simultaneously formed on a wafer as described above, each color solid image pickup element is obtained by cutting each element from the wafer.

As described above, according to the process of this invention, color solid image pickup elements can be easily obtained at low cost by an on-wafer method by using a silver halide photographic technique.

While the invention has been described in detail and with reference to specific embodiment thereof, it will be apparent to one skilled in the art that various changes and modifications can be made therein without departing from the spirit and scope thereof.

What is claimed is:

1. A process of producing a color solid image pickup element base plate comprising the steps of:

coating a solvent permeation preventing layer formed on the surface of a solid image pickup element base plate with a silver halide emulsion layer, removing the silver halide emulsion layer at portions corresponding to bonding pat portions of the solid image pickup element base plate to reveal the solvent permeation preventing layer at the portions, forming a micro color filter composed of at least two-color color separation filter elements corresponding to each image element of the solid image pickup element base plate by repeatedly applying an image exposure and a color development to the remaining silver halide emulsion layer for each color, forming a protective layer on the whole surface of the solid image pickup element base plate having the micro color filter thus formed thereon, and removing the protective layer and the solvent permeation preventing layer at the portions corresponding to the bonding pat portions of the solid image pickup element base plate to reveal the bonding pat portions.

2. The process of producing a color solid image pickup element base plate as claimed in claim 1 wherein the silver halide emulsion layer is formed by spin coating a silver halide emulsion on the base plate.

3. The process of producing a color solid image pickup element base plate as claimed in claim 1 wherein the solid image pickup element base plate has a large number of image pickup elements on the same base plate.

4. The process of producing a color solid image pickup element base plate as claimed in claim 1 wherein the step of forming a micro color filter includes a process of developing the silver halide emulsion layer using a color coupler-containing developer.

5. The process of producing a color solid image pickup element base plate as claimed in claim 1 wherein the step of forming a micro color filter includes a process of developing the silver halide emulsion layer using a developer containing a dye developer.

6. The process of producing a color solid image pickup element base plate as claimed in claim 1 wherein the step of removing the silver halide emulsion layer at the portions corresponding to the bonding pat portions is the step of performing an etch-bleaching procedure after forming silver grains at the portions of image exposing and developing the silver halide emulsion layer at the portions.

7. The process of producing a color solid image pickup element base plate as claimed in claim 1 wherein the step of removing the silver halide emulsion layer at the portions corresponding to the bonding pat portions includes removing the swelled or thickened portion of the silver halide emulsion layer at the peripheral portion of the base plate.

8. The process of producing a color solid image pickup element base plate as claimed in claim 1 wherein the step of removing the silver halide emulsion layer at the portions corresponding to the bonding pat portions includes the step of removing the silver halide emulsion layer at portions to be diced.

9. The process of producing a color solid image pickup element base plate as claimed in claim 1 wherein the solvent permeation preventing layer is composed of phosphosilicate glass.

10. The process of producing a color solid image pickup element base plate as claimed in claim 1 wherein the protective layer is composed of a photoresist.

11. The process for producing a color solid image pickup element base plate as claimed in claim 1 wherein the silver halide emulsion layer has a thickness of from about 0.8 $\mu m$ to about 10 $\mu m$.

12. The process for producing a color solid image pickup element base plate as claimed in claim 1 wherein a subbing layer is positioned between the silver halide emulsion layer and the solvent permeation preventing layer.

* * * * *